United States Patent [19]

Whitney

[11] Patent Number: 5,302,859
[45] Date of Patent: Apr. 12, 1994

[54] SYMMETRIC, HIGH SPEED, VOLTAGE SWITCHING CIRCUIT POSSESSING REVERSE VOLTAGE APPLICATION IMMUNITY

[75] Inventor: Donald K. Whitney, West Melbourne, Fla.

[73] Assignee: Harris Corporation, Melbourne, Fla.

[21] Appl. No.: 791,856

[22] Filed: Nov. 14, 1991

[51] Int. Cl.⁵ .............................................. H03K 5/08
[52] U.S. Cl. .................................................. 307/255
[58] Field of Search ................... 307/255, 257, 296.4, 307/313, 317.1, 321, 254, 243

[56] References Cited

U.S. PATENT DOCUMENTS

| | | | |
|---|---|---|---|
| 3,311,740 | 3/1967 | Urban | 307/257 |
| 4,119,869 | 10/1978 | Hashimoto | 307/317.1 |
| 4,230,956 | 10/1980 | Steinbrecher | 307/257 |
| 4,518,921 | 5/1985 | Logan | 307/257 |
| 4,659,945 | 4/1987 | Metz | 307/257 |
| 4,716,321 | 12/1987 | Erratico | 307/243 |

FOREIGN PATENT DOCUMENTS 0412681 10/1974 U.S.S.R. ......................... 307/257

Primary Examiner—William L. Sikes
Attorney, Agent, or Firm—Charles E. Wands

[57] ABSTRACT

A high speed voltage switching circuit comprises symmetrically arranged voltage relay transistor circuits coupled between voltage input terminals and a switched voltage output terminal. A first voltage relay transistor circuit relays a first voltage at the first input terminal to the output terminal in response to the controlled application of current directly to the output terminal from a first switched current source. A second voltage relay transistor circuit relays a second voltage at the second input terminal directly to the output terminal in response to the removal of current from the output terminal by way of a second switched current source. Each voltage relay transistor circuit preferably comprises pairs of bipolar transistors having their base-emitter junctions coupled in series between the first voltage input terminal and the output terminal. To prevent reverse application of the high and low voltages to the voltage input terminals of the switching circuit, a reverse voltage protection circuit is coupled between the first and second voltage relay transistor circuits.

15 Claims, 2 Drawing Sheets

SYMMETRIC, HIGH SPEED, VOLTAGE SWITCHING CIRCUIT POSSESSING REVERSE VOLTAGE APPLICATION IMMUNITY

FIELD OF THE INVENTION

The present invention relates in general to transistor switching circuits and is particularly directed to a symmetrically configured switching cell for coupling one of high and low voltage inputs to an output terminal with minimum delay and symmetrical rise and fall characteristics of the switched voltage waveform.

BACKGROUND OF THE INVENTION

Automatic test equipment (ATE) manufacturers employ pin driver circuits for controllably applying respective high and low voltages to an output terminal to which a device under test is coupled. FIG. 1 schematically illustrates the basic components of a commercially available pin driver circuit employed in an ATE system manufactured by Fairchild Corporation, in which first and second diode bridge circuits 11 and 13 are respectively coupled between a high voltage VH input terminal 15 and an output terminal 20, on the one hand, and between a low voltage VL input terminal 17 and the output terminal 20, on the other hand. The capacitance associated with output terminal 20 is shown in the figure as a capacitive load 21. Switchably coupled to opposite ends of each diode bridge are respective current sources 22 and 24.

When it is desired to couple the high voltage input VH at terminal 15 to output terminal 20, controlled switching elements 27, 28 are operated to steer each of current sources 22, 24 to diode bridge 11, while diode bridge 13 for the low voltage VL is electrically isolated from the current sources. The high voltage VH at terminal 15 is thus coupled to output terminal 20 through diode bridge 11. Conversely, when it is desired to couple the low voltage input VL at terminal 17 to output terminal 20, controlled switching elements 27, 28 are operated to steer each of current sources 22, 24 to diode bridge 13, while diode bridge 11 is electrically isolated from the current sources. The low voltage VL at terminal 15 is thus coupled to output terminal 20 through diode bridge 13.

Because it can be expected that semiconductor processing of the circuit design will match the characteristics of the diodes of the respective upper portion and lower portion of a bridge, the circuit shown in FIG. 1 will enjoy low offset voltage between the voltage input terminals and output terminal 20. However, because of the inherent capacitance of the diodes, there is a substantial switching delay, and the uneven biasing of the diodes during a transition from low to high (or high to low) will cause current from the source to which the diodes are connected to be apportioned through each diode, which necessitates that buffer circuits be coupled to the input voltage terminals to absorb the current component apportioned to the input terminal.

In the case of diodes 11-1 and 11-2 of the upper portion of diode bridge 11, for example, when output terminal 20 is to transition from a low voltage state (e.g. VL=0) to a high voltage state (e.g. VH=1), diode 11-1 is initially reverse-biased (input terminal 15 is at VH=1), whereas diode 11-2 is forward biased (output terminal 20 is initially at VL=0). Thus, at the start of a low to high transition, the entirety of the current flow path is through diode 11-2 to output terminal 20. As current from source 22 continues to flow and charge capacitive load 21, the forward bias of diode 11-2 begins to decrease, so that the current from source 22 begins to split between diodes 11-1 and 11-2, whereby part of the current will flow to output terminal 20 and part of the current will flow into terminal 15. Because of the inherent capacitance of diodes 11-1 and 11-2, there is an increase in the switching delay in bringing output terminal 20 to the input voltage (e.g. VH=1). Moreover, in order to accommodate the flow of current through the diodes that are connected to the voltage input terminals (e.g. through diode 11-1 to VH voltage input terminal 15), it is necessary to provide respective output buffers for each of voltage input terminals 15 and 17 capable of absorbing substantial current (e.g. milliamps). Thus, the pin driver of FIG. 1 suffers from slow switching speed and the need for additional buffer circuitry components.

SUMMARY OF THE INVENTION

In accordance with the present invention, the above described drawbacks of a conventional dual diode bridge pin driver circuit are effectively obviated by a new and improved voltage switching circuit that offers increased switching speed and stability, low offset current and voltage characteristics, and immunity to the inadvertent application of reverse voltages across the voltage input terminals.

To this end the present invention employs symmetrically arranged first and second voltage relay transistor circuits that are respectively coupled between first and second voltage input terminals and a switched voltage output terminal. The first voltage relay transistor circuit is operative to relay a first voltage (VH) that is applied to the first input terminal to the output terminal in response to the controlled application of current to the output terminal from a first switched current source. Similarly, the second voltage relay transistor circuit is operative to relay a second voltage (VL) that is applied to the second input terminal to the output terminal in response to the removal of current from the output terminal by way of a second switched current source.

When the first switched current source is rendered operative to switchably apply current to the output terminal, the flow of current into the output terminal increases the voltage level at the output terminal to a point that triggers the first voltage relay transistor circuit, so as to cause the first voltage relay transistor circuit to couple the first (high) voltage VH to the output terminal, while the second switched current source is switchably disconnected or isolated from the output terminal. Conversely, when the second switched current source is rendered operative to switchably withdraw current from the output terminal, the voltage level at the output terminal decreases to a point that triggers the second voltage relay transistor circuit, so as to cause the second voltage relay transistor circuit to couple the second (low) voltage VL to the output terminal, while the first switched current source is switchably disconnected or isolated from the output terminal.

The first voltage relay transistor circuit preferably comprises a first plurality (e.g. two pairs) of bipolar transistors of complementary polarity (PNP, NPN) types having their base-emitter junctions coupled in series between the first voltage input terminal and the output terminal, so that there is substantially no net voltage drop between the first voltage input terminal and the output terminal. Similarly, the second voltage relay transistor circuit preferably comprises a second plurality of bipolar transistors of complementary polarity (NPN, PNP) types also having their base-emitter junctions coupled in series between the second voltage input terminal and the output terminal, so that there is substantially no net voltage drop between the second voltage input terminal and the output terminal. One of the transistors within each complementary pair is diode-connected, so as to provide Vbe offset compensation for its counterpart controlled transistor in the other complementary pair.

In order to prevent an inadvertent reverse application of the high and low voltages to the voltage input terminals of the switching circuit, a reverse voltage protection circuit is coupled between the first and second voltage relay transistor circuits and is operative to limit current flow through the voltage relay transistor circuits. The reverse voltage protection circuit comprises a plurality of diode-connected transistors connected in series and having a total voltage drop corresponding to the voltage drop across those transistors of the voltage relay circuits that would otherwise be potentially damaged by reversing the input voltages.

DETAILED DESCRIPTION

Figure 2:
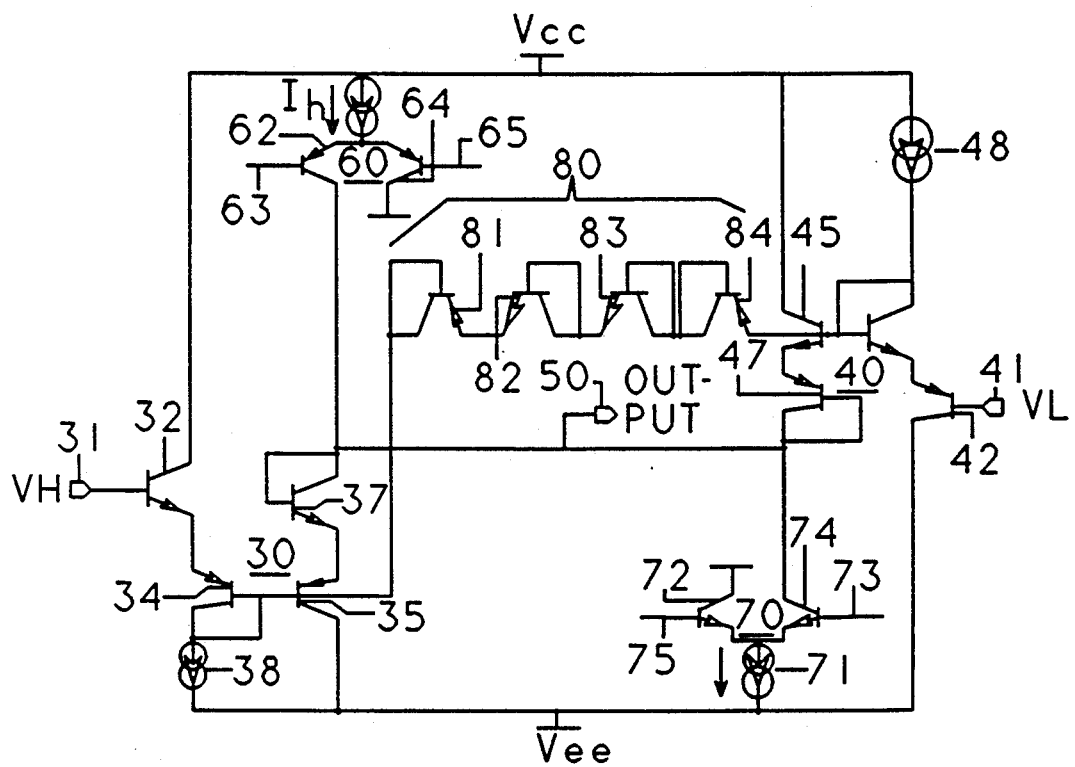
FIG. 2 schematically illustrates a high speed, symmetrically configured voltage switching circuit in accordance with an embodiment of the invention.

A preferred embodiment of a symmetrically configured voltage switching circuit of the present invention is schematically illustrated in FIG. 2 as comprising a pair of voltage relay transistor circuits 30 and 40 that are respectively coupled between first and second voltage input terminals 31 and 41, and a switched voltage output terminal 50. Voltage relay transistor circuit 30 is operative to relay a first (high) voltage (VH) applied to input terminal 31 to output terminal 50 in response to the controlled application of a current Ih to output terminal 50 from a first current switching circuit 60. Current switching circuit 60 includes a first current source 61 coupled in circuit with a first voltage supply rail Vcc and a differential amplifier comprised of PNP transistors 62, 64. When the voltage at the base 63 of transistor 62 is less than that of the base 65 of transistor 64, current source 61 is coupled through the emitter-collector path of transistor 62 to output terminal 50.

Similarly, voltage relay transistor circuit 40 is operative to relay a second (low) voltage (VL) applied to input terminal 41 to output terminal 50 in response to the flow (removal) of current Il from output terminal 50 by way of a second current switching circuit 70. Current switching circuit 70 includes a second current source 71 coupled in circuit with a second voltage supply rail Vee and a differential amplifier comprised of NPN transistors 72, 74. When the voltage at the base 75 of transistor 72 is less than that at the base 73 of transistor 74, current 10 source 71 is coupled through the emitter-collector path of transistor 74 to output terminal 50, so that current is pulled from the output terminal through the collector-emitter path of transistor 74.

It should be noted that control inputs to current switching circuits 60 and 70 are such that the circuits are never simultaneously operative. Namely, when current switching circuit 60 is controlled to couple current source 61 to output terminal 50 transistor 74 of current switching circuit 70 is turned off, so that current source 71 cannot pull current from output terminal 50. Conversely, when current switching circuit 70 is controlled to couple current source 71 to output terminal 50 transistor 62 of current switching circuit 60 is turned off, so that current source 61 cannot inject current into output terminal 50.

Voltage relay transistor circuit 30 comprises two pairs of bipolar transistors of complementary polarity types, comprised of NPN transistor 32 having its base connected to (high) voltage VH input terminal 31, its collector coupled to supply rail Vcc and its emitter coupled to the emitter of a diode-connected PNP transistor 34. The collector-base connection of PNP transistor 34 is coupled to a current source 38. The base of PNP transistor 34 is coupled to the base of PNP transistor 35, the collector of which is coupled to supply rail Vee. The emitter of PNP transistor 35 is coupled to the emitter of a diode-connected NPN transistor 37, the collector of which is coupled to output terminal 50 (and thereby to the collector of current supply transistor 62 of switching circuit 60).

Since the base-emitter junctions of transistors 32, 34, 35, 37 of voltage relay transistor circuit 30 are coupled in series between high voltage VH input terminal 31 and output terminal 50, there is substantially no net voltage drop between voltage input terminal 31 and output terminal 50. Diode-connected PNP transistor 34 and diode-connected NPN transistor 37 within the complementary pairs provide Vbe offset compensation for their counterpart transistors 35 and 32, respectively.

Symmetrically configured voltage relay transistor circuit 40 comprises two pairs of bipolar transistors of complementary polarity types, comprised of PNP transistor 42 having its base connected to (low) voltage VL input terminal 41, its collector coupled to power supply rail Vee and its emitter coupled to the emitter of a diode-connected NPN transistor 44. The collector-base connection of NPN transistor 44 is coupled to a current source 48. The base of NPN transistor 44 is coupled to the base of NPN transistor 45, the collector of which is coupled to supply rail Vcc. The emitter of NPN transistor 45 is coupled to the emitter of a diode-connected PNP transistor 47, the collector of which is coupled to output terminal 50 (and thereby to the collector of current supply transistor 74 of current switching circuit 70). Thus, like voltage relay transistor circuit 30, the base-emitter junctions of transistors 42, 44, 45, 47 of voltage relay transistor circuit 40 are coupled in series between (low) voltage VL input terminal 41 and output terminal 50, so that there is substantially no net voltage drop between voltage input terminal 41 and output terminal 50. Diode-connected NPN transistor 44 and diode-connected PNP transistor 47 within the complementary pairs provide Vbe offset compensation for their counterpart transistors 45 and 42, respectively.

In order to protect the circuit against an improper reverse application of the high VH and low VL voltages to voltage input terminals 41, 31, a reverse voltage protection circuit 80 is coupled between the base node of PNP transistor 35 of voltage relay transistor circuit 30 and the base node of NPN transistor 45 of voltage relay transistor circuit 40. Reverse voltage protection circuit 80 comprises a plurality (four in the present example to accommodate the base-emitter drops of transistors 35, 37, 47, 45) of diode-connected transistors 81, 82, 83, 84 connected in series. The base-emitter drops through transistors 81, 82, 83, 84 equal the sum of the base-emitter voltage drops across transistors 35, 37, 47, 45 of the voltage relay circuits. Reverse voltage protection circuit 80 thereby provides a bypass or shunt current flow path around transistors 35, 37, 47, 45, which would be forward biased and conduct current from sources 48-38 in the presence of a reverse voltage applied to terminals 31, 41, so as to limit the magnitude of the current flow through the voltage relay transistor circuits to a non-damaging level.

OPERATION

Let it be initially assumed that output terminal 50 is at a low voltage state (VL=0) and is to be switched to a high voltage state (VH=1) applied to input terminal 31. With a voltage VH applied to the base of input NPN transistor 32, the base of transistor 34 is two base-emitter diode drops below VH. Current switching circuit 60 is rendered operative to switchably apply current Ih to output terminal 50, while simultaneously, current switching circuit 70 is disabled so that current source 71 is isolated from output terminal 50. Current Ih flows from source 61 into the capacitive load of output terminal 50 and thereby causes the voltage level (presently at VL=0) at output terminal 50 to rise. As the voltage at terminal 50 increases it eventually reaches a value that will forward bias transistors 37 and 35. Since the base of PNP transistor 35 is connected in common with the base of PNP transistor 34, it is also two Vbe drops below VH applied to input terminal 31. With transistors 35 and 37 being turned on the potential at the base-collector tie point of NPN transistor 37 (which is connected to output terminal 50) will be two Vbe drops above the voltage at the base of PNP transistor 35, namely at (VH−2Vbe+2Vbe) or VH. Thus the voltage at output terminal 50 rapidly transitions from VL to VH.

When output terminal 50, which is now at a high voltage state (VH=1), is to be switched to a low voltage state (VL=0) applied to input terminal 41, current switching circuit 70 is rendered operative to switchably pull current Il from output terminal 50, while simultaneously, current switching circuit 60 is disabled so that current source 61 is isolated from output terminal 50. Current Il flows from output terminal 50, discharging its capacitive load, to source 71 and thereby causes the voltage level (presently at VL=1) at output terminal 50 to fall. With a voltage VL applied to the base of input PNP transistor 42, the base of transistor 44 is two base-emitter diode drops above VL. As the voltage at terminal 50 decreases it eventually reaches a value that will forward bias transistors 47 and 45. Since the base of NPN transistor 45 is connected in common with the base of NPN transistor 44, it is also two Vbe drops above VL applied to input terminal 41. With transistors 45 and 47 being turned on, the potential at the base-collector tie point of PNP transistor 47 (which is connected to output terminal 50) will be two Vbe drops below the voltage at the base of NPN transistor 45, namely at (VL+2Vbe−2Vbe) or VL. Thus, the voltage at output terminal 50 rapidly transitions from VH to VL.

Figure 1:
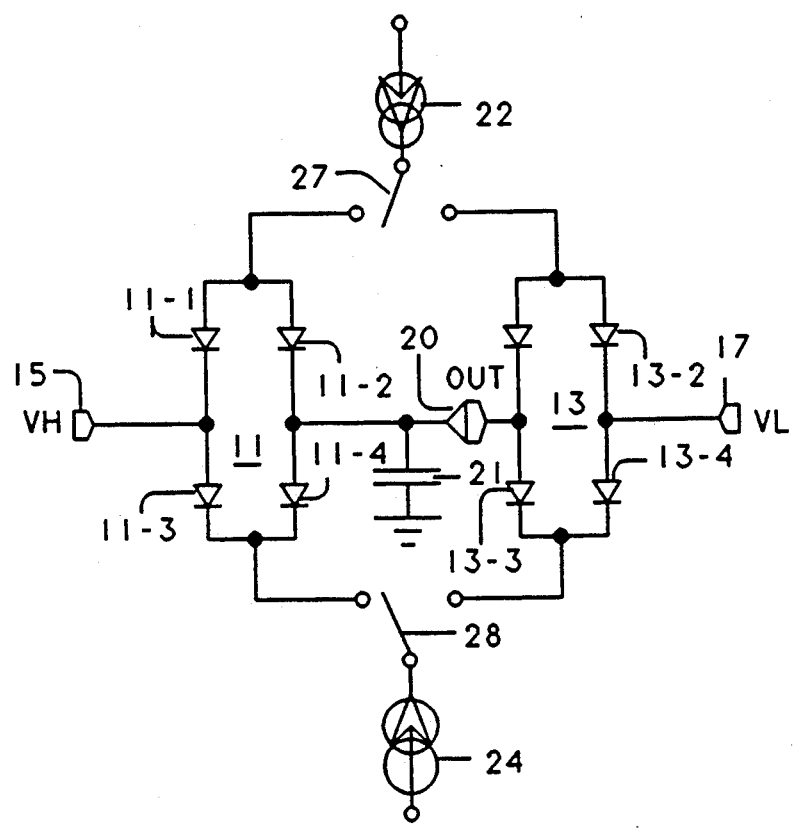
FIG. 1 schematically illustrates the basic components of a conventional pin driver circuit employing first and second diode bridge circuits.

As will be appreciated from the foregoing description, the symmetrically configured voltage switching circuit in accordance with the present invention offers increased switching speed and stability, low offset current and voltage characteristics, and immunity to the inadvertent application of reverse voltages across the voltage input terminals. The speed with which the symmetrical voltage relay circuit of the present invention is able to switch the output terminal between the voltage levels at input terminals 31, 41 is dependent upon the time required to discharge (charge) the diode-connected transistor and base-emitter junctions of the complementary transistor pair (e.g. transistors 45, 47) coupled to output terminal 50, while charging (discharging) the opposite complementary pair (e.g. transistors 35, 37). Because the switched current source (61 or 71) is applied directly to output terminal 50, it is charged directly, as contrasted with the diode bridge configuration of FIG. 1 which splits the current. Moreover, the circuit of FIG. 2 has only four diode junctions, as compared to the eight junctions of the diode bridge circuit of FIG. 1.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed is:

1. A switching circuit for controllably coupling a selected one of a first voltage and a second voltage to an output terminal comprising:

a first input terminal for receiving said first voltage;

a second input terminal for receiving said second voltage;

a first voltage relay circuit coupled between said first input terminal and said output terminal, there being no feedback path provided between said output terminal and said first input terminal;

a second voltage relay circuit coupled between said second input terminal and said output terminal, there being no feedback path provided between said output terminal and said second input terminal;

a first controllable current source which supplies a first current coupled to said output terminal; and a second controllable current source which supplies a second current coupled to said output terminal; and wherein in a first operational state, said first controllable current source being rendered operative to supply said first current to said output terminal so as to cause said first voltage relay circuit to couple said first voltage to said output terminal, while said second controllable current source is rendered inoperative and is thereby isolated from said output terminal, and, in a second operational state, said second controllable current source is rendered operative to supply said second current to said output terminal so as to cause said second voltage relay circuit to couple said second voltage to said output terminal, while said first controllable current source is rendered inoperative and is thereby isolated from said output terminal, further including a reverse voltage protection circuit coupled between said first and second voltage relay circuits and being inoperative to limit current flow through said first and second voltage relay circuits in the event of the application of said first voltage to said second input terminal and said second voltage to said first input terminal.

2. A switching circuit for controllably coupling a selected one of a first voltage and a second voltage to an output terminal comprising:
- a first input terminal for receiving said first voltage;
- a second input terminal for receiving said second voltage;
- a first voltage relay circuit coupled between said first input terminal and said output terminal, there being no feedback path provided between said output terminal and said first input terminal;
- a second voltage relay circuit coupled between said second input terminal and said output terminal, there being no feedback path provided between said output terminal and said second input terminal;
- a first controllable current source which supplies a first current coupled to said output terminal; and
- a second controllable current source which supplies a second current coupled to said output terminal; and wherein
- in a first operational state, said first controllable current source being rendered operative to supply said first current to said output terminal so as to cause said first voltage relay circuit to couple said first voltage to said output terminal, while said second controllable current source is rendered inoperative and is thereby isolated from said output terminal, and, in a second operational state, said second controllable current source is rendered operative to supply said second current to said output terminal so as to cause said second voltage relay circuit to couple said second voltage to said output terminal, while said first controllable current source is rendered inoperative and is thereby isolated from said output terminal, and wherein said first voltage relay circuit comprises a first transistor circuit providing a first polarity current flow path relative to said output terminal, and said second voltage relay circuits comprises a second transistor circuit providing a second polarity current flow path relative to said output terminal.

3. A switching circuit according to claim 2, wherein said first transistor circuit comprises a first transistor of a first polarity type and a second transistor of a second polarity type coupled in series with said first transistor, and wherein said second transistor circuit comprises a third transistor of said second polarity type and a fourth transistor of said first polarity type coupled in series with said third transistor.

4. A switching circuit according to claim 3, wherein each of said second and fourth transistors is configured as a diode-connected transistor.

5. A switching circuit according to claim 3, further including a reverse voltage protection circuit coupled between said first and second voltage relay transistor circuits and being operative to limit current flow through said first and second voltage relay transistor circuits in the event of the application of said first voltage to said second input terminal and said second voltage to said first input terminal.

6. A switching circuit according to claim 5, wherein said reverse voltage protection circuit comprises a plurality of diode-connected transistors connected in series and having a voltage drop thereacross corresponding to the voltage drop across said first through fourth transistors.

7. A switching circuit for controllably coupling a selected one of a first voltage and a second voltage to an output terminal comprising:
- a first input terminal to which said first voltage is applied;
- a second input terminal to which said second voltage is applied;
- a first voltage relay transistor circuit coupled between said first input terminal and said output terminal and being operative to relay the first voltage applied to said first input terminal to said output terminal in response to application of current to said output terminal, there being no feedback path provided between said output terminal and said first input terminal;
- a second voltage relay transistor circuit coupled between said second input terminal and said output terminal and being operative to relay the second voltage applied to said second input terminal to said output terminal in response to removal of current from said output terminal, there being no feedback path provided between said output terminal and said second input terminal;
- a first current supply circuit, which supplies a first current, switchably coupled to said output terminal; and
- a second current supply circuit, which supplies a second current, switchably coupled to said output terminal; and wherein
- in a first operational state said first current supply circuit is rendered operative to switchably apply said first current to said output terminal so as to cause said first voltage relay transistor circuit to couple said first voltage to said output terminal, while said second current circuit is rendered inoperative and is thereby isolated from said output terminal, and in a second operational state said second current supply circuit is rendered operative to switchably withdraw said second current from said output terminal so as to cause said second voltage relay transistor circuit to couple said second voltage to said output terminal while said first current supply circuit is rendered inoperative and is thereby isolated from said output terminal, further including a reverse voltage protection circuit coupled between said first and second voltage relay transistor circuits and being operative to limit current flow through said first and second voltage relay transistor circuits in the event of the application of said second voltage to said second input terminal and said second voltage to said first input terminal.

8. A switching circuit for controllably coupling a selected one of a first voltage and a second voltage to an output terminal comprising:
- a first input terminal to which said first voltage is applied;
- a second input terminal to which said second voltage is applied;
- a first voltage relay transistor circuit coupled between said first input terminal and said output terminal and being operative to relay the first voltage applied to said first input terminal to said output terminal in response to application of current to said output terminal, there being no feedback path provided between said output terminal and said first input terminal;
- a second voltage relay transistor circuit coupled between said second input terminal and said output terminal and being operative to relay the second voltage applied to said second input terminal to said output terminal in response to removal of current from said output terminal, there being no feedback path provided between said output terminal and said second input terminal;

a first current supply circuit, which supplies a first current, switchably coupled to said output terminal; and a second current supply circuit, which supplies a second current, switchably coupled to said output terminal; and wherein in a first operational state said first current supply circuit is rendered operative to switchably apply said first current to said output terminal so as to cause said first voltage relay transistor circuit to couple said first voltage to said output terminal, while said second current circuit is rendered inoperative and is thereby isolated from said output terminal, and in a second operational state said second current supply circuit is rendered operative to switchably withdraw said second current from said output terminal so as to cause said second voltage relay transistor circuit to couple said second voltage to said output terminal while said first current supply circuit is rendered inoperative and is thereby isolated from said output terminal, and wherein said first voltage relay transistor circuit has a first polarity current flow path relative to said output terminal, and said second voltage relay transistor circuit has a second polarity current flow path relative to said output terminal.

9. A switching circuit according to claim 8, wherein said first voltage relay transistor circuit comprises a first transistor of a first polarity type and a second transistor of a second polarity type coupled in series with said first transistor, and wherein said second voltage relay transistor circuit comprises a third transistor of said second polarity type and a fourth transistor of said first coupled in series with said third transistor.

10. A switching circuit according to claim 9, wherein each of said second and fourth transistors is configured as a diode-connected transistor.

11. A switching circuit according to claim 10, further including a reverse voltage protection circuit coupled between said first and second voltage relay transistor circuits and being operative to limit current flow through said first and second voltage relay transistor circuits in the event of the application of said first voltage to said second input terminal and said second voltage to said first input terminal.

12. A switching circuit according to claim 11, wherein said reverse voltage protection circuit comprises a plurality of diode-connected transistors connected in series and having a voltage drop thereacross corresponding to the voltage drop across said first through fourth transistors.

13. A switching circuit for controllably coupling a selected one of a first voltage and a second voltage to an output terminal comprising:

a first input terminal to which said first voltage is applied;

a second input terminal to which said second voltage is applied;

a first voltage relay transistor circuit coupled between said first input terminal and said output terminal and being operative to relay the first voltage applied to said first input terminal to said output terminal in response to application of current to said output terminal, there being no feedback path provided between said output terminal and said first input terminal;

a second voltage relay transistor circuit coupled between said second input terminal and said output terminal and being operative to relay the second voltage applied to said second input terminal to said output terminal in response to removal of current from said output terminal, there being no feedback path provided between said output terminal and said second input terminal;

a first current supply circuit, which supplies a first current, switchably coupled to said output terminal; and a second current supply circuit, which supplies a second current, switchably coupled to said output terminal; and wherein in a first operational state said first current supply circuit is rendered operative to switchably apply said first current to said output terminal so as to cause said first voltage relay transistor circuit to couple said first voltage to said output terminal, while said second current circuit is rendered inoperative and is thereby isolated from said output terminal, and in a second operational state said second current supply circuit is rendered operative to switchably withdraw said second current from said output terminal so as to cause said second voltage relay transistor circuit to couple said second voltage to said output terminal while said first current supply circuit is rendered inoperative and is thereby isolated from said output terminal, and wherein said first voltage relay transistor circuit comprises a first plurality of transistors of complementary polarity types coupled between said first input terminal and said output terminal and having substantially no net voltage drop thereacross in an internal junction circuit path between said first input terminal and said output terminal, and wherein said second voltage relay transistor circuit comprises a second plurality of transistors of complementary polarity types coupled between said second input terminal and said output terminal and having substantially no net voltage drop thereacross in an internal junction circuit path between said second input terminal and said output terminal.

14. A switching circuit for controllably coupling a selected one of a first voltage and a second voltage to an output terminal comprising:

a first input terminal to which said first voltage is applied;

a second input terminal to which said second voltage is applied;

a first voltage relay transistor circuit coupled between said first input terminal and said output terminal and being operative to relay the first voltage applied to said first input terminal to said output terminal in response to application of current to said output terminal, there being no feedback path provided between said output terminal and said first input terminal;

a second voltage relay transistor circuit coupled between said second input terminal and said output terminal and being operative to relay the second voltage applied to said second input terminal to said output terminal in response to removal of current from said output terminal, there being no feedback path provided between said output terminal and said second input terminal;

a first current supply circuit, which supplies a first current, switchably coupled to said output terminal; and a second current supply circuit, which supplies a second current, switchably coupled to said output terminal; and wherein in a first operational state said first current supply circuit is rendered operative to switchably apply said first current to said output terminal so as to cause said first voltage relay transistor circuit to couple said first voltage to said output terminal, while said second current circuit is rendered inoperative and is thereby isolated from said output terminal, and in a second operational state said second current supply circuit is rendered operative to switchably withdraw said second current from said output terminal so as to cause said second voltage relay transistor circuit to couple said second voltage to said output terminal while said first current supply circuit is rendered inoperative and is thereby isolated from said output terminal, and wherein said first plurality of transistors of complementary polarity types comprises a first pair of bipolar transistors of a first polarity type and a second pair of bipolar transistors of a second polarity type coupled with said first pair of bipolar transistors such that the base-emitter junctions of said first plurality of transistors are coupled in series between said first input terminal and said output terminal, and wherein said second plurality of transistors of complementary polarity types comprises a third pair of bipolar transistors of said fourth polarity type and a second pair of bipolar transistors of said first second polarity type coupled with said first pair of bipolar transistors such that the base-emitter junctions of said second plurality of transistors are coupled in series between said second input terminal and said output terminal, and such that the polarity orientations of the base-emitter junctions of said second plurality of transistors are opposite to the polarity orientations of the base-emitter junctions of said first plurality of transistors.

15. A method of controllably coupling to an output terminal a selected one of a first voltage that is applied to a first input terminal and a second voltage that is applied to a second input terminal, comprising the steps of:

(a) coupling a first voltage relay transistor circuit between a first input terminal and said output terminal, said first voltage relay circuit being operative to relay the first voltage applied to said first input terminal to said output terminal is response to application of current to said output terminal, there being no feedback path provided between said output terminal and said first input terminal;

(b) coupling a second voltage relay transistor circuit between said second input terminal and said output terminal, said voltage relay circuit being operative to relay the second voltage applied to said second input terminal to said output terminal is response to removal of current from said output terminal, there being no feedback path provided between said output terminal and said second input terminal; and (c) providing a first current supply circuit which supplies a first current and a second current supply circuit which supplies a second current and, in order to couple said first voltage to said output terminal, controllably rendering said first current supply circuit operative to thereby apply said first current to said output terminal, so as to cause said first voltage relay transistor circuit to couple said first voltage to said output terminal, while rendering said second current supply circuit inoperative, and whereby electrically isolating said second current supply circuit from said output terminal, and, in order to couple said second voltage to said output terminal, controllably rendering said second current supply circuit operative to withdraw said second current from said output terminal so as to cause said second voltage relay transistor circuit to couple said second voltage to said output terminal, while rendering said first current supply circuit inoperative and thereby electrically isolating said first current supply circuit from said output terminal, and further including the step (d) of coupling a reverse voltage protection circuit between said first and second voltage relay transistor circuits, said reverse voltage protection circuit being operative to limit current flow through said first and second voltage relay transistor circuits in the event of the application of said first voltage to said second input terminal and said second voltage to said first input terminal.

* * * * *